(12) United States Patent
Braunisch et al.

(10) Patent No.: US 7,684,660 B2
(45) Date of Patent: Mar. 23, 2010

(54) METHODS AND APPARATUS TO MOUNT A WAVEGUIDE TO A SUBSTRATE

(75) Inventors: Henning Braunisch, Chandler, AZ (US); Daoqiang Lu, Chandler, AZ (US); Nathaniel Arbizu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 774 days.

(21) Appl. No.: 11/166,577

(22) Filed: Jun. 24, 2005

(65) Prior Publication Data

US 2006/0291771 A1 Dec. 28, 2006

(51) Int. Cl.
*G02B 6/26* (2006.01)

(52) U.S. Cl. .............................. 385/14; 385/31; 385/39; 385/52; 385/57; 385/88

(58) Field of Classification Search .................... 385/14, 385/31, 39, 88, 52, 27; 438/25, 27, 31
See application file for complete search history.

(56) References Cited

U.S. PATENT DOCUMENTS

| 6,083,843 | A * | 7/2000 | Ohja et al. | 438/710 |
| 6,231,771 | B1 * | 5/2001 | Drake | 216/24 |
| 6,690,845 | B1 * | 2/2004 | Yoshimura et al. | 385/14 |
| 6,952,514 | B2 * | 10/2005 | Lee et al. | 385/52 |
| 6,970,612 | B2 * | 11/2005 | Ouchi | 385/14 |
| 7,283,699 | B2 * | 10/2007 | Lu et al. | 385/15 |
| 2001/0055447 | A1 * | 12/2001 | Delprat et al. | 385/50 |
| 2003/0179979 | A1 * | 9/2003 | Ouchi | 385/14 |
| 2005/0036728 | A1 | 2/2005 | Braunisch et al. | |
| 2006/0067609 | A1 * | 3/2006 | Lu et al. | 385/15 |

OTHER PUBLICATIONS

Mohammed et al., *Optical I/O technology for digital VLSI*, Photonics Packaging and Integration IV, edited by Randy A. Heyler, Ray T. Chen, Proceedings of SPIE vol. 5358 (SPIE, Bellingham, WA, 2004).
Mohammed et al., *Optical interconnect system integration for ultra-short-reach applications*, Intel Technology J., vol. 8, pp. 115-127, May 2004.
Lu et al., U.S. Appl. No. 10/664,475, filed Sep. 17, 2003, Methods and Apparatus to Optically Couple an Optoelectronic Chip to a Waveguide, Pending.
Towle et al., U.S. Appl. No. 10/955,897, filed Sep. 30, 2004, Manufacturable Connectorization Process for Optical Chip-To-Chip Interconnects, Pending.

(Continued)

*Primary Examiner*—James P Hughes
(74) *Attorney, Agent, or Firm*—Hanley, Flight and Zimmerman, LLC

(57) ABSTRACT

Methods and apparatus to mount an optical waveguide to a substrate are disclosed. A disclosed method involves providing a substrate having a first layer and a second layer. The first layer includes at least one alignment fiducial and the second layer covers the at least one fiducial. At least a portion of the second layer is removed to render the fiducial visible and a waveguide is automatically aligned with the first fiducial. The waveguide is then fixed to the substrate.

21 Claims, 5 Drawing Sheets

OTHER PUBLICATIONS

Vandentop et al. U.S. Appl. No. 10/934,858, filed Sep. 3, 2004, Waveguide Coupling Mechanism, Pending.

Vandentop et al. U.S. Appl. No. 10/954,903 filed Sep. 30, 2004, Optical Package, Pending.

Vandentop et al., U.S. Appl. No. 11/124,033, filed May 6, 2005, Flip-Chip Mountable Optical Connector for Chip-To-Chip Optical Interconnectability, Pending.

Lu et al., U.S. Appl. No. 11/096,504, filed Mar. 29, 2005, Passively Aligned Optical-Electrical Interface, Pending.

* cited by examiner

METHODS AND APPARATUS TO MOUNT A WAVEGUIDE TO A SUBSTRATE

FIELD OF THE DISCLOSURE

The present disclosure relates generally to optical packages and, more particularly, to methods and apparatus to mount a waveguide to a substrate.

BACKGROUND

Optical packages are typically manufactured using traditional methods that enable optoelectronic chips to communicate with other devices. These traditional methods often include wire-bonding and/or flip-chip packaging processes. These optical packages are generally used in an optical communication system for transmitting and receiving high bandwidth optical signals.

Both optical wire-bond packages and optical flip-chip packages generally include an optoelectronic chip, a substrate and a light energy or radiant energy conducting element such as, for example, an optical fiber or a waveguide. The optoelectronic chip includes an optical element and electrically conductive contacts. The optical element, which may include a transmitter and/or receiver, is generally responsible for transmitting and/or receiving optical signals via the optical fiber and/or waveguide. The optical fiber and/or waveguide is generally adhered or attached to a substrate. Additionally, the electrically conductive contacts of the optoelectronic chip are electrically bonded to a substrate for transmitting and/or receiving electrical signals.

Flip-chip packaging is a proven method for manufacturing optical packages. A flip-chip package may include a waveguide that is adhered to a substrate and that is disposed between an optoelectronic chip and the substrate. During a bonding process, the optoelectronic chip is positioned relative to the waveguide using an active alignment process (i.e., using a sensor, a laser, and a feedback loop) to achieve optimal light or radiant energy signal coupling to the waveguide. The position of the optoelectronic chip relative to the waveguide is limited by the position of the solder pads formed on the substrate. To ensure optimal alignment during the bonding process, the position of the waveguide must be optimally fixed to the substrate relative to the solder pads.

A traditional method of attaching a waveguide to a substrate typically involves using a microscope and a micropositioner to manually align the waveguide to adjacent substrate features such as solder pads. A liquid adhesive is disposed between the waveguide and the substrate and cured to fix the waveguide to the substrate. This method is not well-adaptable for automated processes because the optical alignment tolerance between a waveguide and an optoelectronic chip is +/−5 µm and aligning the waveguide to adjacent substrate features may not meet this tolerance in high-volume manufacturing. Further, using this method, at least two substrate features must be selected to ensure optimal alignment along the X-direction and the Y-direction. The limited viewing range of a microscope typically requires moving the viewing area of a vision recognition system (e.g., a machine vision system) after aligning the waveguide in the X-direction to align the waveguide in the Y-direction, often causing misalignment in, for example, the X-direction.

DETAILED DESCRIPTION

Figure 1:
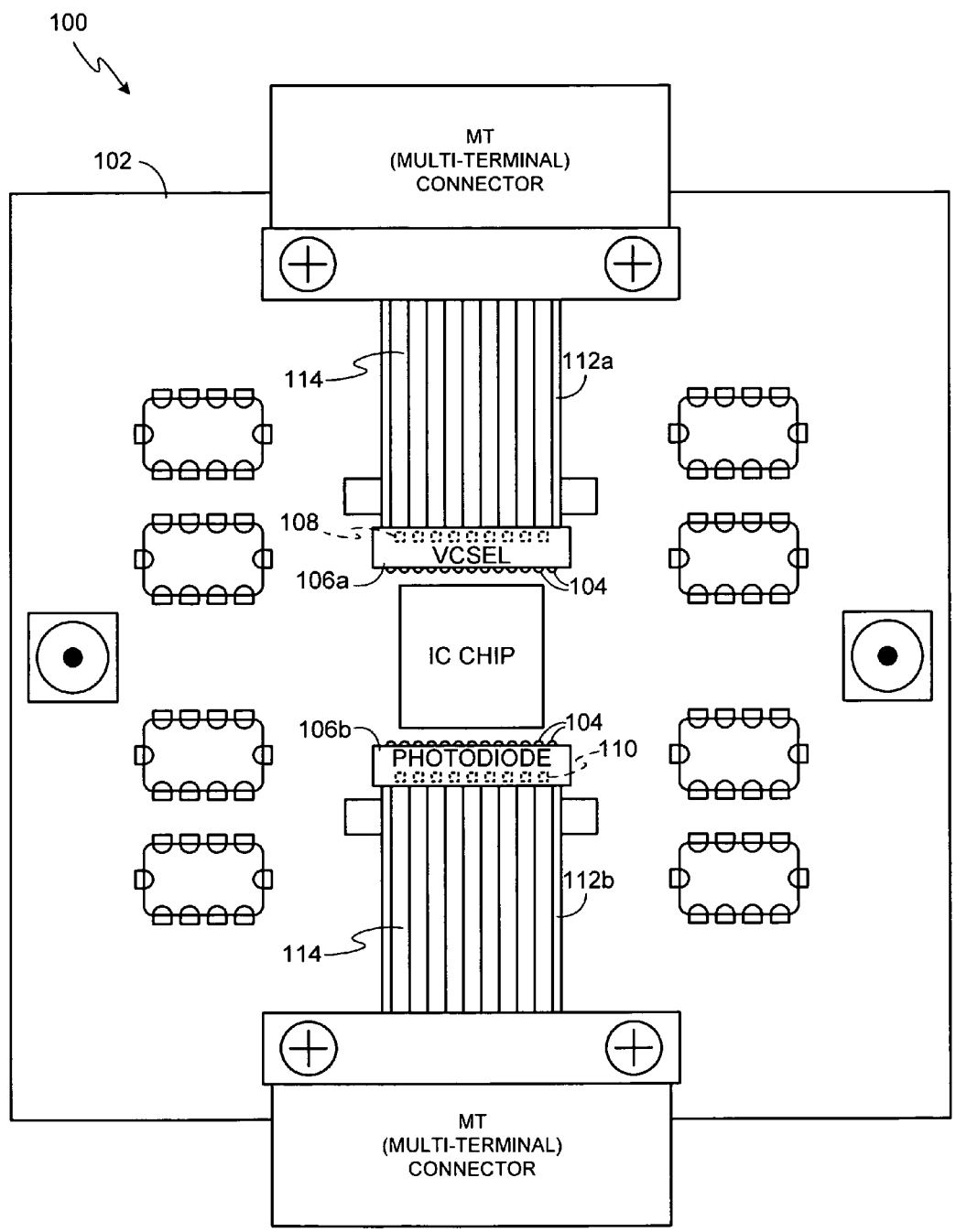
FIG. 1 is a top view of an example optoelectronic assembly.

FIG. 1 is a top view of an example optoelectronic assembly 100. The example optoelectronic assembly 100 includes an example substrate 102. Although the substrate 102 is shown in FIG. 1 as a printed circuit board (PCB) substrate, the substrate 102 may be implemented using any type of substrate. Thus, the substrate 102 may be formed from any desired type of material. For example, the substrate 102 may be made of an insulative, non-conductive material. The substrate 102 may also have any desired form. In the illustrated example, the substrate 102 includes a generally planar surface conducive to flip-chip bonding and/or waveguide coupling. Additionally, the substrate 102 may include one or more circuits or portions of circuits. For instance, circuit lines or traces may be printed on or layered within the substrate 102. To couple circuit elements (e.g., an integrated circuit, a capacitor, an inductor, etc.) to the circuit lines or traces, the substrate 102 may further be provided with electrically conductive contacts 104 (i.e., solder pads).

The substrate 102 is illustrated by way of example as a printed circuit board (PCB) substrate. The PCB may be provided with a chip-bonding surface adapted to mount a flip-chip using flip-chip on board (FCoB) bonding. In such an example, the chip-bonding surface is provided with electrically conductive contacts that are communicatively connected to electrically conductive traces printed on and/or in the PCB substrate.

In another example, the substrate 102 is implemented using a flex substrate such as a flexible PCB substrate. A flex substrate generally has material properties that enable bending or flexing of the substrate. The bendability of a flex substrate makes it particularly useful in mechanically demanding environments. The flex substrate may be provided with a chip-bonding surface adapted to mount a flip-chip using flip-chip on flex (FCoF) bonding. In such an example, the chip-bonding surface includes electrically conductive contacts that are communicatively connected to electrically conductive traces which are printed on and/or in the flex substrate.

In still another example, the substrate 102 is implemented using a chip-package substrate such as a flip-chip package (e.g., an FCxGA package such as an FCPGA, FCBGA, or FCLGA package). A flip-chip package includes electrically conductive contacts on a chip-bonding surface. These contacts are communicatively connected to a second set of electrically conductive contacts on an opposite surface of the chip-package substrate. The second set of contacts may be coupled to, for example, traces on a PCB via a solder interface, suitable socket and/or interposer.

To convert data between radiant energy (e.g., light energy) and electrical energy the example optoelectronic assembly 100 includes first and second optoelectronic chips or die 106a and 106b bonded to the substrate 102. The optoelectronic chips 106a and 106b may be implemented using any desired integrated circuit having any desired purpose or functionality. In the illustrated example, the optoelectronic chip 106a is a flip-chip vertical cavity surface emitting laser (VCSEL) array having a plurality of radiant energy emitter elements 108 to convert electrical energy to radiant energy and the optoelectronic chip 106b is a flip-chip photodiode array having a plurality of photodiode elements 110 to convert radiant energy to electrical energy.

To transfer radiant energy between the optoelectronic chips 106a and 106b and destinations or sources, the optoelectronic assembly 100 includes a first waveguide 112a mounted to the substrate 102 and optically coupled to the first optoelectronic chip 106a and a second waveguide 112b mounted to the substrate 102 and optically coupled to the second optoelectronic chip 106b.

In the illustrated example, the waveguides 112a and 112b are planar waveguide arrays that include a plurality of lightwave channels 114. Each of the lightwave channels 114 of the waveguide 112a is aligned to one of the radiant energy emitter elements 108 of the optoelectronic chip 106a and each of the lightwave channels 114 of the waveguide 112b is aligned to one of the photodiode elements 110 of the optoelectronic chip 106b. The lightwave channels 114 must be optimally aligned with the elements 108 and 110 to maximize the amount of radiant energy that is transferred between the optoelectronic chips 106a and 106b and the waveguides 112a and 112b, respectively.

Figure 2:
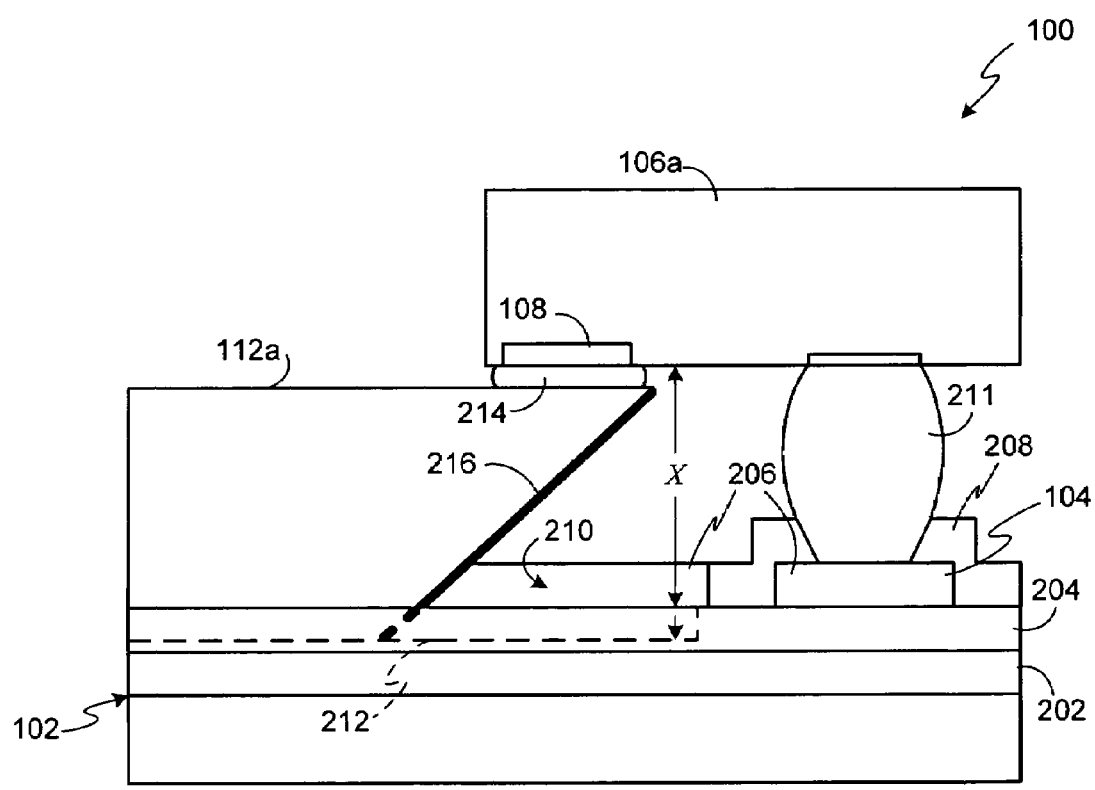
FIG. 2 depicts a side view of a portion of the example optoelectronic assembly of FIG. 1.

FIG. 2 depicts a side view of a portion of the example optoelectronic assembly 100 of FIG. 1, in which the waveguide 112a is mounted to the substrate 102 adjacent to the solder pad 104. The substrate 102 includes a first layer 202 (e.g., a metal layer) and a second layer 204 (e.g., a dielectric layer) formed on the first layer 202. In the illustrated example, the second layer 204 is formed using an Ajinomoto Buildup Film (ABF). The substrate 102 also includes a third layer 206 (e.g., a metal layer) that is used to form the solder pad 104. A solder mask layer 208 (i.e., a solder resist mask layer) is then formed on portions of the third layer 206 and the second layer 204.

A portion or portions of the third layer 206 and the solder mask layer 208 may be patterned to form a solder mask void or a patterned trench 210. The patterned trench 210 exposes the second layer 204 in an area of the substrate 102 engaging the waveguide 112a to create a clearance X between the optoelectronic chip 106a and the substrate 102 that allows tucking the waveguide 112a under the optoelectronic chip 106a. In the illustrated example, the amount of clearance X required to allow tucking the waveguide 112a under the optoelectronic chip 106a is dictated by the maximum height of a solder joint 211 that bonds the optoelectronic chip 106a to the substrate 102. To further increase the clearance X, a portion of the second layer 204 may be laser milled, plasma etched, or otherwise removed to form an optional trench 212. Although the optional trench 212 may be of any size and shape, in some implementations the optional trench 212 may be substantially similar or identical in size and shape to the patterned trench 210.

As also shown in FIG. 2, a portion of the optoelectronic chip 106a engages the waveguide 112a via an optical couplant 214 and another portion of the optoelectronic chip 106a is flip-chip bonded to the solder pad 104 via the solder joint 211. The waveguide 112a includes a mirrored surface 216 that reflects radiant energy emitted from the radiant energy emitter elements 108 and directs the radiant energy along the lightwave channels 114 (FIG. 1) of the waveguide 112a in a direction away from the optoelectronic chip 112a. Optimal alignment between the radiant energy emitter elements 108 and the mirrored surface 216 optimizes the amount of radiant energy that is redirected from the radiant energy emitter elements 108 via the mirrored surface 216.

Unlike traditional methods of mounting waveguides to substrates that require using substrate features (e.g., the solder pads 104) located adjacent to the waveguides 112a and 112b as landmarks for alignment, in the illustrated example, optimal alignment between the mirrored surface 216 and each of the elements 108 and 110 (FIG. 1) and optimal alignment between each of the lightwave channels 114 and each of the elements 108 and 110 are achieved using buried alignment fiducials described below in connection with FIGS. 3-8.

Figure 3:
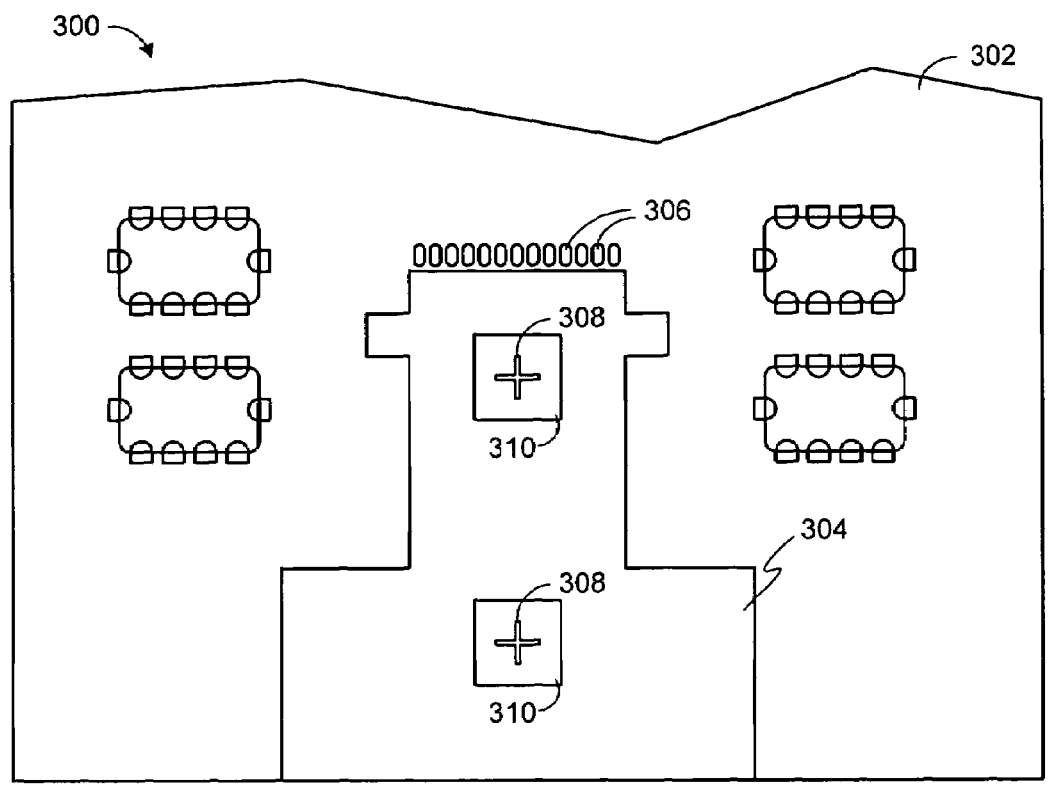
FIG. 3 depicts a top view of a portion of another example optoelectronic assembly.

FIG. 3 depicts a top view of a portion of another example optoelectronic assembly 300. The example optoelectronic assembly 300 is substantially similar to the example optoelectronic assembly 100 of FIG. 1. For example, the optoelectronic assembly 300 includes a substrate 302 having a first layer and a second layer (e.g., a metal and a dielectric layer) (not shown). Also, a patterned trench 304 is formed adjacent electrically conductive contacts 306 (i.e., solder pads) and is substantially similar or identical to the patterned trench 210 described above in connection with FIG. 2. The substrate 302 includes buried alignment fiducials 308 that are formed in the first layer of the substrate 302 as described below in connection with FIG. 5 and made visible through a second layer of the substrate 302. For example, alignment fiducials 308 may be formed by patterning a metal layer and a solder mask layer (e.g., the third layer 206 and the solder mask layer 208 of FIG. 2) to expose the second layer of the substrate 302 as described above in connection with FIG. 2. In some cases, as described below, the alignment fiducials 308 may be made visible by removing portions of the second layer to form apertures 310 using, for example, a laser milling process or a plasma etch process. The alignment fiducials 308 are formed at locations on the substrate 302 that enable aligning a waveguide (e.g., the waveguide 402 of FIG. 4) with, for example, an optoelectronic chip (e.g., the optoelectronic chips 106a and 106b).

Figure 4:
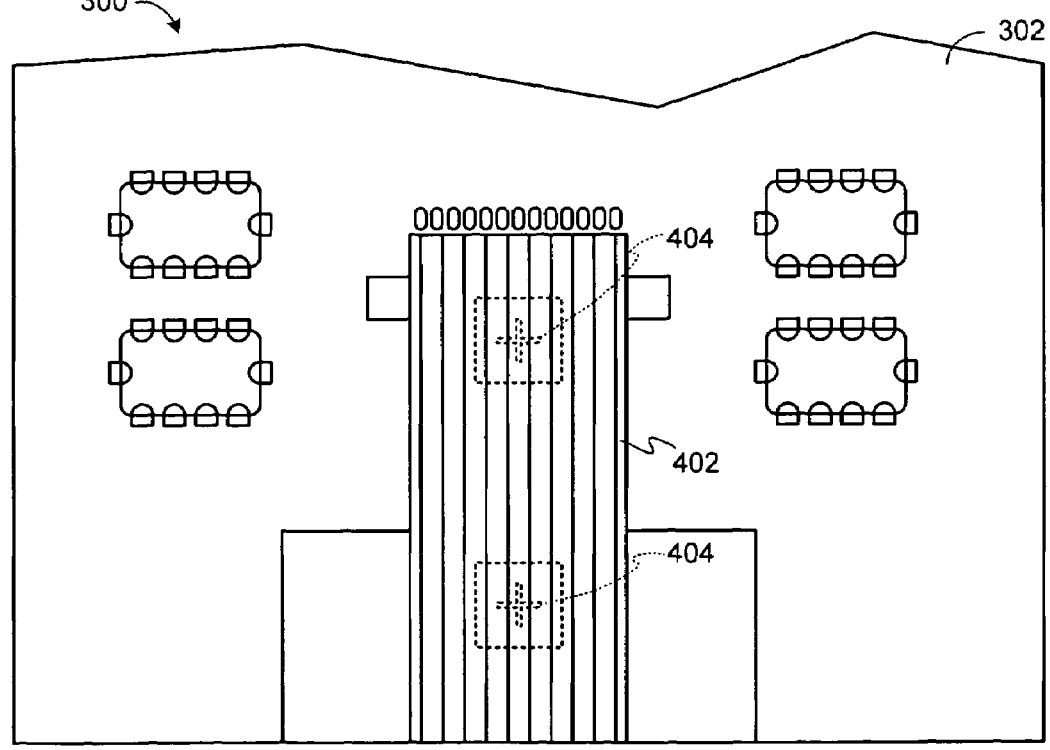
FIG. 4 depicts a waveguide aligned to the alignment fiducials of FIG. 3.

After forming the alignment fiducials 308 in the first layer, the alignment fiducials 308 are subsequently obscured or hidden by the second layer that is formed on the first layer. In some cases, the material of the second layer is sufficiently transparent to allow the alignment fiducials 308 to be visible through the material of the second layer. Thus, patterning the third layer 206 and the solder mask layer 208 (FIG. 2) to form the patterned trench 304 is sufficient to expose the alignment fiducials 308 through the second layer. However, if the second layer is not sufficiently transparent to make the alignment fiducials 308 visible, the alignment fiducials 308 are exposed or made visible by removing portions of material from the second layer or otherwise forming the apertures 310 in the second layer surrounding the alignment fiducials 308. The apertures 310 may be formed by, for example, laser milling or plasma etching portions of material from the second layer surrounding the alignment fiducials 308. The apertures 310 are formed within the patterned trench 304 as shown in FIG. 3 so that, for example, a waveguide may be aligned with a position of an optoelectronic chip (e.g., the optoelectronic chips 106a and 106b) by aligning alignment fiducials formed in the waveguide to the alignment fiducials 308 as shown in FIG. 4. In an alternative implementation, the apertures 310 or the material removed from the second layer may be extended along the surface of the second layer to form the optional trench 212 (FIG. 2), which may be substantially similar or identical in size and shape to the patterned trench 304.

FIG. 4 depicts an example waveguide 402 aligned to the example alignment fiducials 308 of FIG. 3. Specifically, in the example optoelectronic assembly 300 of FIGS. 3 and 4, the waveguide 402 includes alignment fiducials 404 formed therein having a shape that is substantially similar or identical to the alignment fiducials 308. During a manufacturing or assembly process, a pick-and-place device and a vision recognition device (e.g., a machine vision device) may be used to align each of the alignment fiducials 404 in the waveguide 402 with a respective one of the alignment fiducials 308 in the substrate 302 and to subsequently fix the waveguide 402 to the substrate 302. Aligning the alignment fiducials 308 and 404 preferably optimizes the amount of radiant energy that is transferred between the waveguide 402 and an optoelectronic chip (e.g., the optoelectronic chips 106a and 106b).

Figure 5:
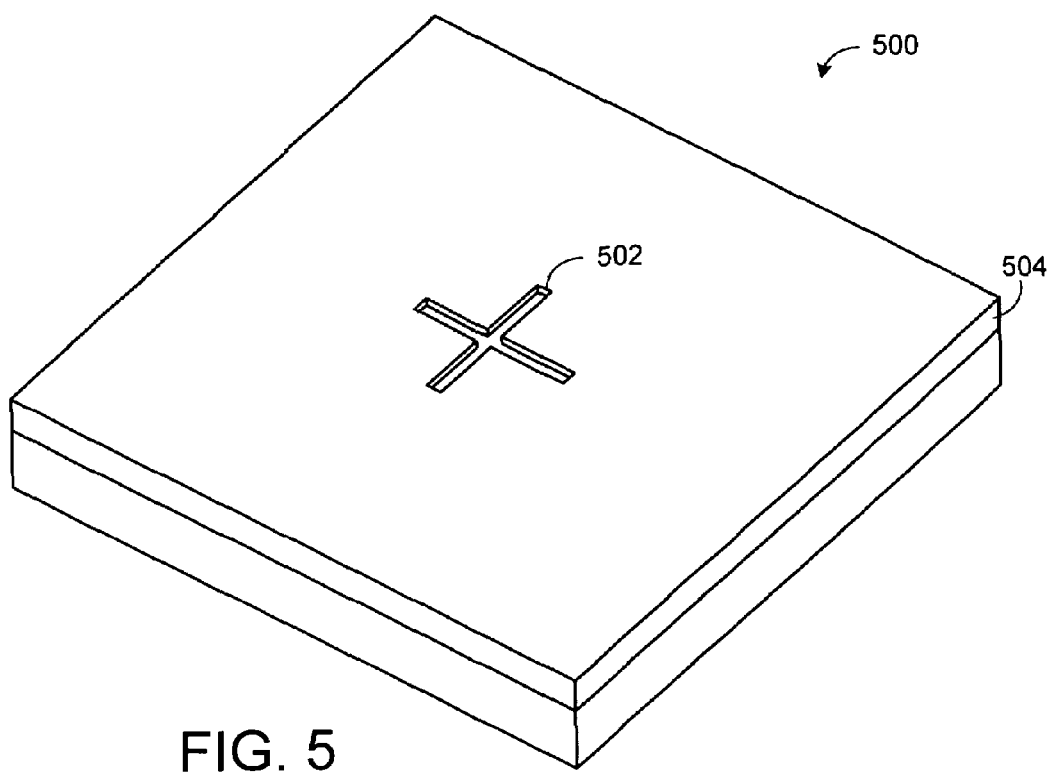
FIGS. 5-7 depict an example substrate during stages of a fabrication process during which an example alignment fiducial is formed in the substrate.
Figure 6:
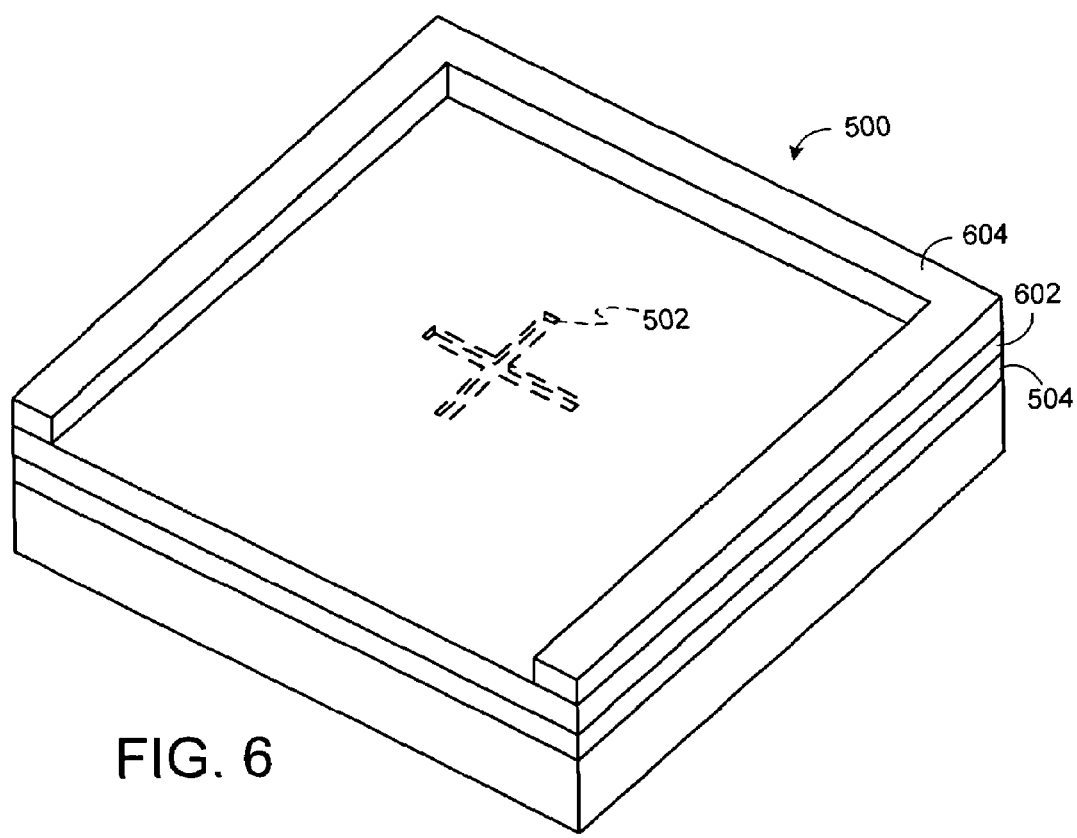
Figure 7:
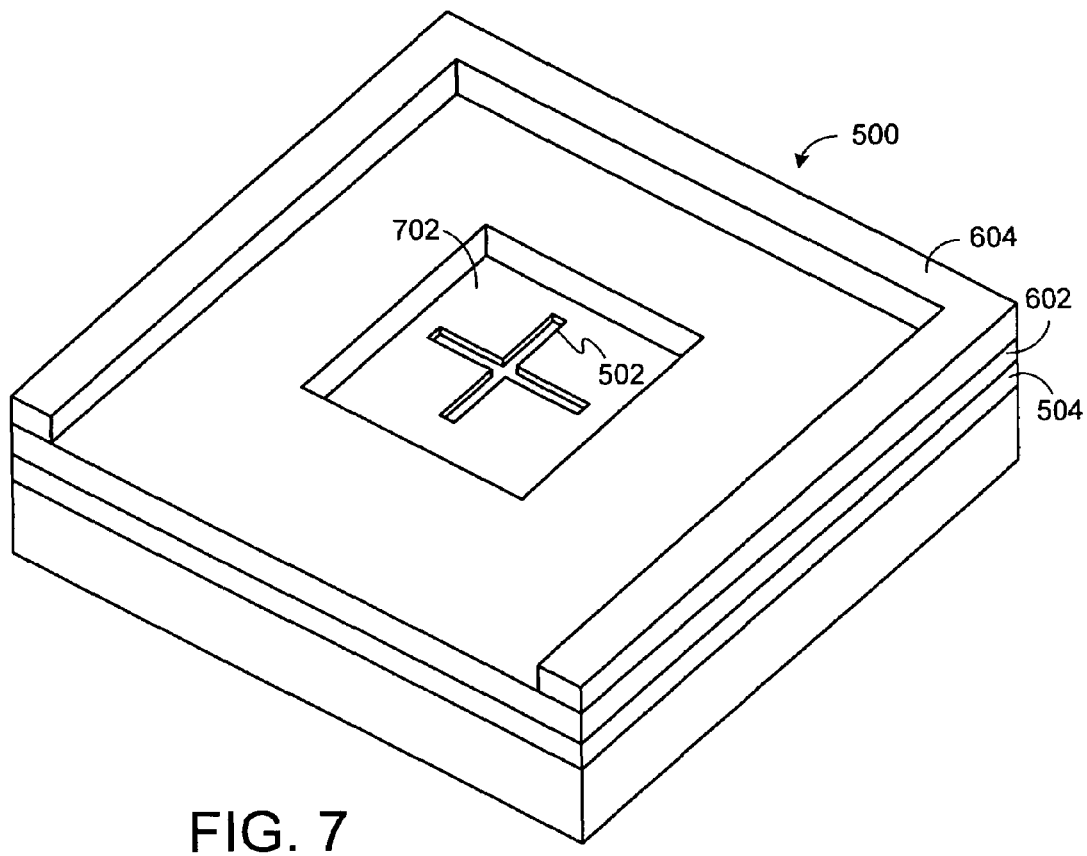

FIGS. 5-7 depict an example substrate 500 during stages of an example fabrication process during which an example alignment fiducial 502 is formed in the substrate 500. The example alignment fiducial 502 may be formed using standard layout design tools and microelectronic substrate fabrication techniques. FIG. 5 shows the substrate 500 with the example alignment fiducial 502 formed in a first layer 504 (e.g., a metal layer). The alignment fiducial 502 may be formed by forming the first layer 504 on the substrate 500 using a known process and applying a radiant energy-sensitive or light-sensitive photoresist (not shown) to the first layer 504 in a pattern shape corresponding to the alignment fiducial 502. The portion of the first layer 504 that is not masked using the radiant energy sensitive photoresist is then removed using a chemical etch process to form the alignment fiducial 502 by creating one or more void(s) or absence(s) of material in the first layer 504. In some implementations, an alignment fiducial may comprise a plurality of disjoint or separate voids. The disjoint or separate voids may be configured to further enhance alignment accuracy for particular optoelectronic assemblies.

As shown in FIG. 6, after forming the alignment fiducial 502 in the first layer 504, a second layer 602 (e.g., a dielectric layer) is formed on the first layer 504, and a patterned layer 604 (e.g., the third layer 206 and/or the solder mask layer 208 of FIG. 2) is formed on the second layer 602. The second layer 602 obscures or hides the alignment fiducial 502. If the material used to form the second layer 602 is sufficiently transparent, the alignment fiducial 502 may be rendered visible through the material of the second layer 602. However, if the second layer 602 is not sufficiently transparent, a portion of the second layer 602 may be subsequently removed to expose the alignment fiducial 502 through the second layer 602 during a subsequent manufacturing process. For example, as shown in FIG. 7, the alignment fiducial 502 is exposed or rendered visible via an aperture 702 that is formed by removing a portion of the second layer 602 surrounding the alignment fiducial 502. The aperture 702 may be formed using a laser milling process, a plasma etching process, or any other suitable technique known in the art.

In an alternative example implementation, the alignment fiducial 502 may be exposed by removing sufficient material from the second layer 602 surrounding the alignment fiducial 502 to form a recess (not shown) having a depth less than a thickness of the second layer 602. In this case, the second layer 602 may have a semi-transparent property (at least when milled to a thin enough thickness) that allows the image of the alignment fiducial 502 to be viewed through the second layer 602 by a vision recognition device.

One of ordinary skill in the art will readily appreciate that during a manufacturing or fabrication process one or more circuit elements (e.g., resistors, capacitors, integrated circuits, etc.) (not shown) may be secured to the substrate 500 prior to removing a portion of the second layer 602 to render the alignment fiducial 502 visible as described above. As will also be appreciated by one of ordinary skill in the art, the first and second layers 504 and 602 may be used to form circuit elements (e.g., capacitors, resistors, traces, etc.) (not shown) on the substrate 500.

Figure 8:
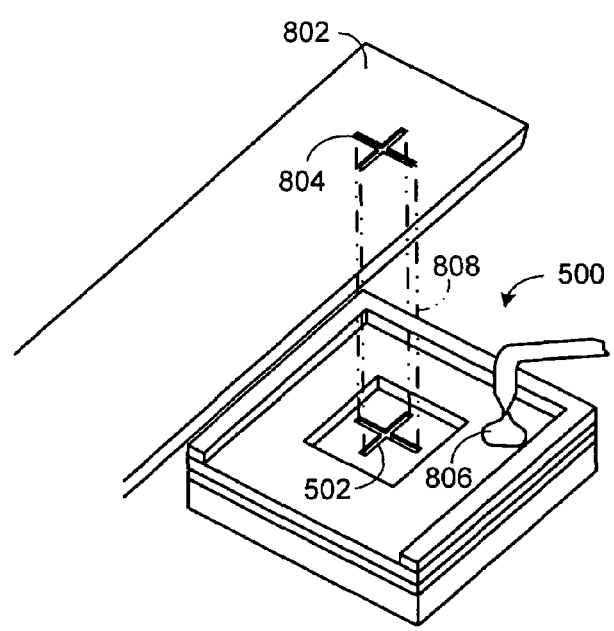
FIG. 8 depicts an example waveguide aligned to the example substrate of FIGS. 5-7.

FIG. 8 depicts an example waveguide 802 aligned to the example substrate 500 of FIGS. 5-7. In the illustrated example, the waveguide 802 includes an alignment fiducial 804 that, when aligned with the alignment fiducial 502 of the substrate 500, causes the waveguide 802 to be optimally positioned on the substrate 500 relative to an optoelectronic chip (e.g., the optoelectronic chips 106a and 106b of FIG. 1).

In the example implementation depicted in FIG. 8, the alignment fiducial 804 is substantially similar or identical in shape to the alignment fiducial 502. However, in other implementations the alignment fiducial 804 may be different in shape or form, but still capable of optimally positioning the waveguide 802 on the substrate 500 when select features of the alignment fiducial 804 are aligned with select features of the alignment fiducial 502.

During a manufacturing or assembly process, an adhesive 806 such as, for example, an ultraviolet light-activated adhesive is applied to the substrate 500 prior to engaging the waveguide 802 to the substrate 500. The waveguide 802 may then be positioned on the substrate 500 using a pick-and-place device (not shown) and a vision recognition device (not shown). The pick-and-place device may be used to position the waveguide 802 on the substrate 500. The vision recognition device may be configured to use pattern recognition processes to align the alignment fiducial 804 (or features thereof) with the alignment fiducial 502 (or features thereof). In FIG. 8, phantom lines 808 depict an alignment configuration between the alignment fiducials 502 and 804. After the alignment fiducials 502 and 804 are aligned, the pick-and-place device engages the waveguide 802 to the substrate 500 and the waveguide 802 is fixed to the substrate 500 by curing the adhesive 806 using, for example, an ultraviolet light, an elevated temperature, or any other known suitable curing technique.

A person of ordinary skill in the art will readily appreciate that the example methods, apparatus, and articles of manufacture described herein may be used in combination with many types of applications, circuits, or communication devices. For example, the optoelectronic assemblies 100 (FIG. 1) and 300 (FIGS. 3 and 4) and/or the substrate 500 and the waveguide 802 (FIG. 8) may be used in telecommunication routers, telecommunication switches, or any other type of communication or computation circuit.

Although certain example methods, apparatus and articles of manufacture have been described herein, the scope of coverage of this patent is not limited thereto. On the contrary, this patent covers all apparatus, methods and articles of manufacture fairly falling within the scope of the appended claims either literally or under the doctrine of equivalents.

What is claimed is:

1. An apparatus for use with an optoelectronic flip-chip assembly, comprising:
   a substrate;
   a metal layer on the substrate and having at least one alignment fiducial formed therein;
   a dielectric layer formed on the metal layer, wherein the alignment fiducial is obscured by the dielectric layer; and
   a waveguide having a second alignment fiducial formed therein, wherein the waveguide is placed on at least one of the dielectric layer or the metal layer based on an alignment between the second alignment fiducial of the waveguide and the at least one alignment fiducial of the metal layer, and wherein the waveguide is preformed and separate from the substrate, the metal layer, and the dielectric layer prior to being placed on the at least one of the dielectric layer or the metal layer.

2. An apparatus for use with an optoelectronic flip-chip assembly, comprising:
   a substrate;
   a metal layer on the substrate and having at least one alignment fiducial formed therein, wherein the alignment fiducial comprises at least one void in the metal layer;
   a dielectric layer formed on the metal layer; and a waveguide having a second alignment fiducial formed therein, wherein the waveguide is placed on at least one of the dielectric layer or the metal layer based on an alignment between the second alignment fiducial of the waveguide and the at least one alignment fiducial of the metal layer, and wherein the waveguide is preformed and separate from the substrate, the metal layer, and the dielectric layer prior to being placed on the at least one of the dielectric layer or the metal layer.

3. An apparatus as defined in claim 2, further comprising a trench formed in the dielectric layer over the alignment fiducial.

4. An apparatus as defined in claim 2, wherein the alignment fiducial is visible through the dielectric layer via an aperture formed in the dielectric layer.

5. An apparatus as defined in claim 2, wherein the alignment fiducial is visible through the dielectric layer via a recess formed in the dielectric layer having a depth that is less than a thickness of the dielectric layer.

6. An apparatus as defined in claim 1, wherein the waveguide is fixed to the substrate.

7. An apparatus as defined in claim 6, further comprising an optoelectronic die having a first portion engaging the waveguide and a second portion flip-chip bonded to the substrate.

8. An apparatus as defined in claim 2, wherein a portion of the dielectric layer is removed to expose the alignment fiducial.

9. An apparatus as defined in claim 1, wherein the alignment fiducial comprises a plurality of separate voids in the metal layer.

10. An apparatus for use with an optoelectronic flip-chip assembly, comprising:
    a first material layer;
    a fiducial formed in the first material layer;
    a second material layer formed on the first material layer;
    a trench formed in the second material layer, wherein the trench exposes the fiducial; and
    a waveguide having a second fiducial formed therein, wherein the waveguide is placed on at least one of the first material layer or the second material layer based on an alignment between the second fiducial of the waveguide and the fiducial formed in the first material layer, and wherein the waveguide is preformed and separate from the first material layer and the second material layer prior to being placed on the at least one of the first material layer or the second material layer.

11. An apparatus as defined in claim 10, wherein the fiducial is obscured by the second material layer.

12. An apparatus as defined in claim 10, wherein the first material layer is a metal layer, and wherein the second material layer is a dielectric layer.

13. An apparatus as defined in claim 10, wherein the fiducial comprises at least one void in the first material layer.

14. An apparatus as defined in claim 10, wherein the fiducial is an alignment fiducial.

15. An apparatus as defined in claim 10, further comprising an aperture formed in the trench of the second material layer, wherein the fiducial is visible through the aperture.

16. An apparatus as defined in claim 10, further comprising a recess formed in the second material layer having a depth that is less than a thickness of the second material layer, wherein the fiducial is visible through the recess.

17. An apparatus as defined in claim 10, further comprising:
    a third material layer formed on the second material layer; and
    an optoelectronic die having a first portion engaging the waveguide and a second portion flip-chip bonded to the third material layer.

18. An apparatus as defined in claim 10, wherein a portion of the second material layer is removed to expose the fiducial.

19. An apparatus as defined in claim 10, wherein the fiducial comprises a plurality of separate voids in the first material layer.

20. A system comprising the apparatus of claim 10 coupled to a telecommunication router.

21. An apparatus as defined in claim 10, further comprising an optoelectronic die having a first portion engaging the waveguide and a second portion flip-chip bonded to a solder pad.

* * * * *